United States Patent [19]
Yasui et al.

[11] Patent Number: 5,292,371
[45] Date of Patent: Mar. 8, 1994

[54] MICROWAVE PLASMA CVD APPARATUS COMPRISING DUAL PLUNGERS FOR TWO-DIMENSION PLASMA POSITION ADJUSTMENT

[75] Inventors: Haruo Yasui; Munehiro Chosa, both of Sodegaura, Japan

[73] Assignee: Idemitsu Petrochemical Co., Ltd., Tokyo, Japan

[21] Appl. No.: 966,368

[22] Filed: Oct. 26, 1992

Related U.S. Application Data

[63] Continuation of PCT/JP92/00205, Feb. 25, 1992, abandoned.

[30] Foreign Application Priority Data

Feb. 26, 1991 [JP] Japan .................................. 3-54072

[51] Int. Cl.$^5$ ............................................. C23C 16/50
[52] U.S. Cl. ...................... 118/723 MW; 156/DIG. 68
[58] Field of Search .................. 118/723; 156/345; 333/99 PL; 204/298.38; 315/111.21, 111.41

[56] References Cited

U.S. PATENT DOCUMENTS

4,065,369  12/1977  Ogawa et al. .................... 204/164
5,078,823  1/1992  Chollet et al. ................... 156/345

FOREIGN PATENT DOCUMENTS

63-166970  7/1988  Japan .
64-655279  3/1989  Japan .

OTHER PUBLICATIONS

Moisan et al, "The Waveguide surfatron: a high power surface-wave launcher to sustain large-diameter dense plasma columns", J. Phys. E. Sci. Instrum, vol. 20, pp. 1356-1361, 1987.

Primary Examiner—Brian E. Hearn
Assistant Examiner—Jonathan D. Baskin
Attorney, Agent, or Firm—Kanesaka and Takeuchi

[57] ABSTRACT

A microwave plasma chemical vapor deposition apparatus allows the position of a plasma to be two-dimensionally adjusted in a reaction tube. A second plunger 9 (plunger assembly 8) is disposed on an H plane of a microwave waveguide 2a connected to a microwave oscillator 1 adjacent to an end 2b of the microwave waveguide 2a in facing relationship to a reaction region 7. The plunger 9 is actuated to move the plasma also in a direction perpendicular to the direction of travel of a microwave in the microwave waveguide 2a for two-dimensionally adjusting the position of the plasma. Using the microwave plasma chemical vapor deposition apparatus, a diamond film having a uniform quality and a uniform thickness is formed as on a substrate.

3 Claims, 4 Drawing Sheets

Fig. 1
Fig. 2
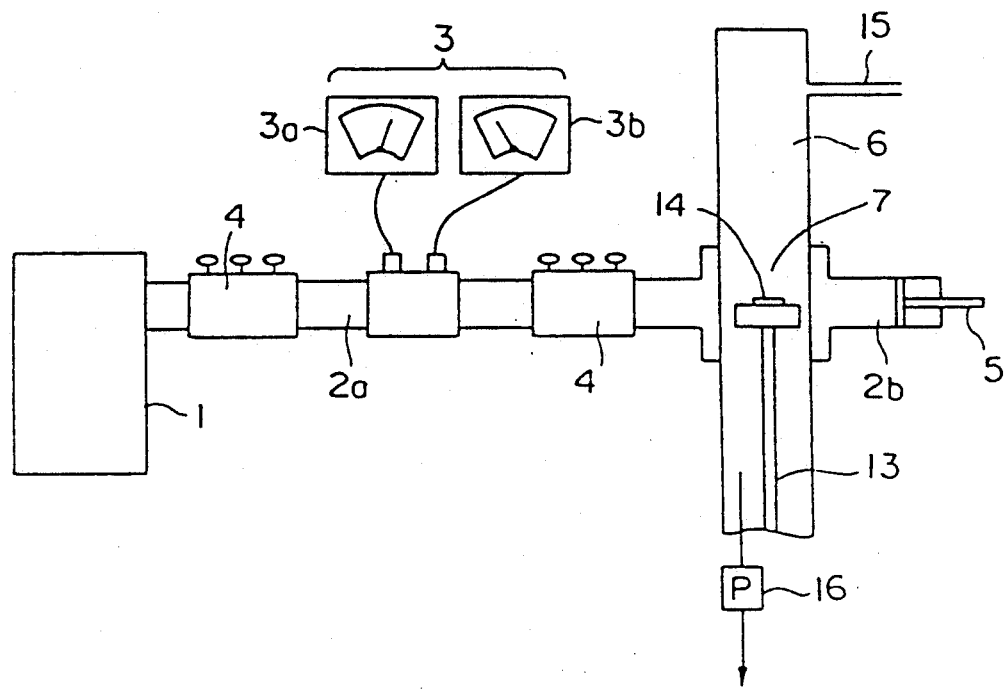
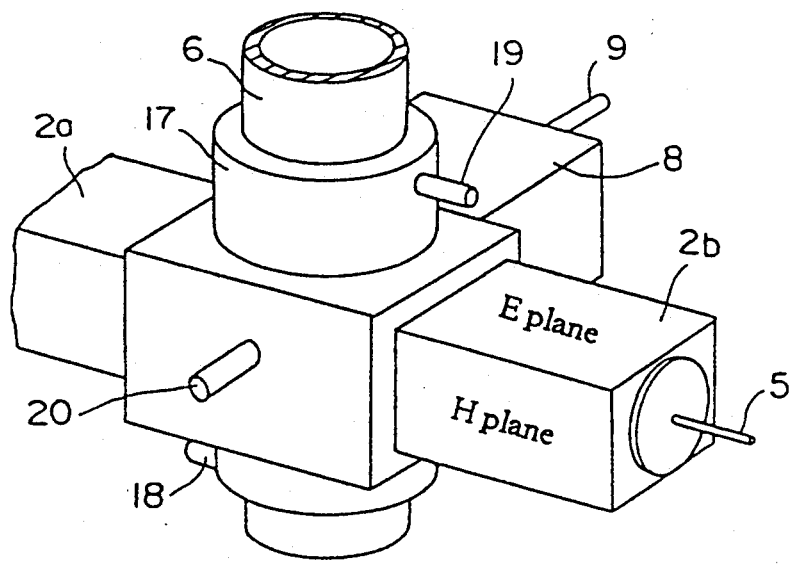

(a)

(b)

(c)

(a)

(b)

(c)

(d)

MICROWAVE PLASMA CVD APPARATUS COMPRISING DUAL PLUNGERS FOR TWO-DIMENSION PLASMA POSITION ADJUSTMENT

CROSS-REFERENCE TO RELATED APPLICATION

This is a continuation application of PCT International Application No. PCT/JP92/00205 filed on Feb. 25, 1992, now abandoned.

TECHNICAL FIELD

The present invention relates to a microwave plasma chemical vapor deposition (CVD) apparatus which is capable of two-dimensionally adjusting the position of a plasma in a reaction tube, and a method of synthesizing a diamond film of uniform quality and thickness on a substrate with the microwave plasma CVD apparatus.

BACKGROUND ART

The microwave plasma CVD process employs a microwave to excite and decompose a material gas to generate a plasma which forms a thin film on a substrate or a base. The microwave plasma CVD process is finding use in a wide range of applications from the fabrication of semiconductors to the synthesis of thin films of diamond. The microwave plasma CVD process is highly practical as it can achieve desired film qualities, film thicknesses, and film yields with high reproducibility.

One conventional microwave plasma CVD apparatus is illustrated in FIG. 6 of the accompanying drawings. In FIG. 6, the microwave plasma CVD apparatus includes a microwave waveguide 2a having an end 2b and an E plane which is perpendicular to an electric vector, and a cylindrical reaction tube 6 of quartz extending through the waveguide 2a perpendicularly to the E plane at a position adjacent to the end 2b of the waveguide 2a. A shorting plunger 5 is mounted in the end 2b of the waveguide 2a.

The shorting plunger 5 serves as a short-circuiting device for fully reflecting a microwave which has traveled in the waveguide 2a. When the shorting plunger 5 is actuated, a plasma generated in the reaction tube 6 is moved several cm only in the direction of travel of the microwave, thereby finely adjusting the position where the plasma is generated.

The microwave plasma CVD apparatus is usually adjusted in advance to position of the center of the plasma at the central axis of the reaction tube 6. When the shorting plunger 5 is adjusted, the position where the plasma is generated can be moved one-dimensionally in the direction of travel of the microwave. However, it is not possible to move the plasma in a direction normal to the direction of travel of the microwave, and hence to adjust the position of the plasma two-dimensionally.

Since the reaction tube 6 of quartz is transparent, it does not inherently absorb or reflect the microwave. However, if any by-product is deposited on the inner wall surface of the reaction tube 6 during a reaction process, then the by-product deposit absorbs or reflects the microwave.

Any changes in the cross-sectional area of the waveguide 2a or the presence of electric charges or currents in the waveguide wall may interrupt electric and magnetic fields, causing the microwave to spread in perpendicular and oblique directions as well as to travel straight.

If the travel of the microwave in the reaction tube 6 is disturbed, then the distribution of electric field intensities is made uneven, and so is the plasma. When a thin film of diamond, for example, is synthesized by CVD under such a condition, the plasma and the base on which the thin film is to be formed have an ununiform distribution of temperatures. As a result, the quality of the diamond film, the rate at which the diamond film is synthesized, and the thickness of the diamond film become irregular. In the case where the synthesized diamond film is used as the film on a diamond coated tool, e.g., a cutting tool, the cutting performance and the tool life may vary due to the different thicknesses of the diamond film at the respective corners of the cutting tip of the tool. Therefore, the tool cannot be used for stably cutting workpieces.

Therefore, it is an object of the present invention to provide a microwave plasma CVD apparatus which is capable of two-dimensionally adjusting the position of a plasma in a reaction tube.

Another object of the present invention is to provide a method of synthesizing a diamond film of uniform quality and thickness on a substrate with the above microwave plasma CVD apparatus.

DISCLOSURE OF THE INVENTION

To achieve the above objects, the inventors has conducted intensive research and found out that it is possible to move a plasma generated in a reaction tube in a direction perpendicular to the direction of travel of a microwave, with a shorting plunger which can make fine adjustment of the diameter of the reaction tube.

According to the present invention, there is provided a microwave plasma chemical vapor deposition apparatus comprising a microwave oscillator, a microwave waveguide, a first plunger mounted in an end of the microwave waveguide, and a reaction tube extending through the microwave waveguide perpendicularly to an E plane thereof adjacent to the end of the microwave waveguide, the microwave waveguide and the reaction tube jointly defining a reaction region at an intersection thereof, wherein the improvement comprises a second plunger disposed on an H plane of the microwave guide adjacent to the end thereof, the second plunger extending perpendicularly to the microwave waveguide and the reaction tube and facing the reaction region.

According to the present invention, there is also provided a method of synthesizing diamond using the above microwave plasma chemical vapor deposition apparatus, comprising the steps of exciting a carbon source gas and forming a diamond film on a base.

The position of the plasma in the reaction tube is two-dimensionally adjusted to form a diamond or diamond-like thin film having a uniform quality and a uniform thickness on a substrate or base. A diamond or diamond-like thin film will hereinafter be referred to as diamond or a diamond film.

BRIEF DESCRIPTION OF THE DRAWINGS

FIG. 1 is a schematic view of a microwave plasma CVD apparatus according to the present invention;

FIG. 2 is a fragmentary perspective view of the microwave plasma CVD apparatus;

BEST MODE FOR CARRYING OUT THE INVENTION

Figure 3:
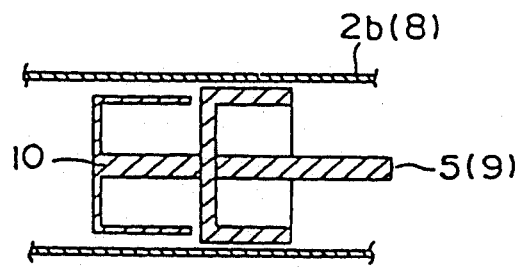
FIGS. 3(a), 3(b), and 3(c) are fragmentary cross-sectional views of various different plungers that can be used in the microwave plasma CVD apparatus.
Figure 3:
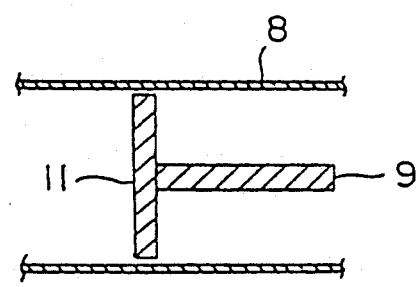
Figure 3:
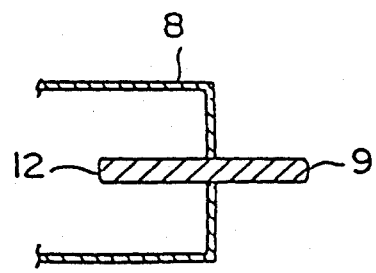

The present invention will be described below in detail with reference to the accompanying drawings.

As shown in FIG. 1, a microwave plasma CVD apparatus according to the present invention generally comprises a microwave oscillator 1, a microwave waveguide 2a, a cylindrical reaction tube 6, and a plunger 5.

The microwave oscillator 1 generates a microwave of a predetermined frequency, e.g., 2.45 GHz. The generated microwave may be directly introduced into the reaction tube 6, or may be introduced into the reaction tube 6 after it has been modulated into a pulse wave.

The microwave waveguide 2a is in the form of a hollow transmission device of metal in which the microwave generated by the microwave oscillator 1 is propagated. The microwave waveguide 2a usually comprises a rectangular waveguide having a rectangular cross-sectional shape.

A power monitor 3 is connected to the microwave waveguide 2a. The microwave waveguide 2a has two spaced three-stub tuners (matching devices) 4. The power monitor 3 measures output intensities of supplied and reflected waves, and regulates the three-stub tuners 4 so that the reflected wave will be minimized. The power monitor 3 comprises a power monitor unit 3a for measuring the output intensity of the supplied wave, and a power monitor unit 3b for measuring the output intensity of the reflected wave.

A first plunger 5, which is the same as the known shorting plunger, is mounted in an end 2b of the microwave waveguide 2a. The plunger 5 serves as a short-circuiting device for fully reflecting a microwave which has traveled in the waveguide 2a.

The reaction tube 6 extends vertically through the microwave waveguide 2a perpendicularly to a E plane of the microwave waveguide 2a at a position adjacent to the end 2b thereof. A space region in the reaction tube 6 where the reaction tube 6 and the microwave waveguide 2a intersect with each other serves as a reaction region 7 in which a plasma is generated for reaction. The reaction tube 6 is usually made of a material such as quartz which allows the microwave to pass therethrough without loss and which is chemically stable.

The reaction tube 6 extends perpendicular to the upper surface (lying in the E plane which contains a longer side of the rectangular cross-sectional shape of the microwave waveguide 6) of the microwave waveguide 6 because a leakage of the microwave in a direction perpendicular to the upper surface of the microwave waveguide 6 is greater than a leakage of the microwave in a direction perpendicular to a side surface (lying in an H plane which contains a shorter side of the rectangular cross-sectional shape of the microwave waveguide 6) of the microwave waveguide 6.

The microwave plasma CVD apparatus also has a plunger assembly 8 (see FIG. 2) mounted on a side surface (H plane) of the microwave waveguide 2a adjacent to the end 2b thereof. The plunger assembly 8 lies perpendicularly to both the microwave waveguide 2a and the reaction tube 6, and faces the reaction region 7. The plunger assembly 8 comprises a second plunger (side shorting plunger) 9 (see FIG. 2).

Each of the first and second plungers 5, 9 may comprise a fully reflecting plunger 10 as shown in FIG. 3(a). However, the second plunger 9 may alternatively be in the form of a plate 11 as shown in FIG. 3(b) or a pin 12 as shown in FIG. 3(c). The second plunger 9 should preferably be of the fully reflecting type as shown in FIG. 3(a) in view of the generation of heat owing to a loss of microwave.

An opening in the microwave waveguide 2a which leads to the second plunger 9 should preferably have a length equal to half of the wavelength of the microwave in the direction in which the microwave travels.

As shown in FIG. 1, a substrate holder 13 is disposed in the reaction region 7 in the reaction tube 6, and a substrate 14 is placed on the substrate holder 13. The substrate holder 13 is associated with a heating means or a cooling means for adjusting the temperature of the substrate 14. When a thin film is to be formed on the surface of a base having a desired three-dimensional shape, a base holder 13 suitable for supporting and fixing such a base is prepared.

A material gas supply pipe 15 is connected to an upper portion of the reaction tube 6 for supplying a material gas (including a plasma gas) into the reaction tube 6. An evacuating pump 16 is connected to a lower portion of the reaction tube 6 for evacuating the reaction tube 6 to a certain vacuum.

As shown in FIG. 2, a double-walled water cooling jacket 17 is disposed around the reaction tube 6 in the vicinity of the reaction region 7 for passing cooling water therethrough to cool the reaction tube 6 to prevent the re action tube 6 and its surrounding area from being excessively heated. The water cooling jacket 17 has a cooling water inlet 18 for introducing the cooling water and a cooling water outlet 19 for discharging the cooling water. The portion of the water cooling jacket 17 which intersects with the microwave waveguide 2a has a window for passage of the microwave therethrough.

An observation window 20 is provided for the operator to observe the condition of the plasma and the vertical position of the base in the reaction region 7. The observation window 20 normally comprises a pipe having a length of 40 mm and a diameter of 10 mm for preventing the microwave from leaking out of the reaction region 7.

A close observation of the energized condition of the plasma, particularly a positional displacement of the plasma in the direction of the second plunger 9, is made through an observation window on the upper portion of the reaction tube 6.

Figure 4:
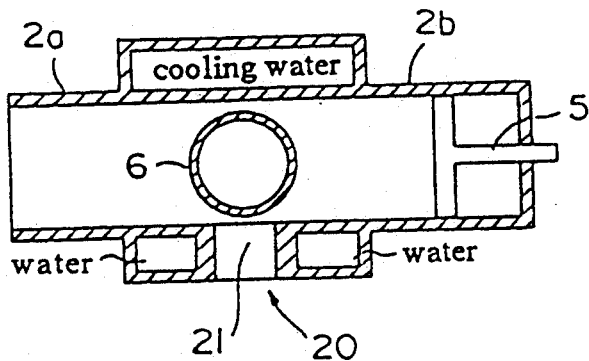
FIGS. 4(a) is a fragmentary cross sectional view of a microwave plasma CVD apparatus with a simple plunger placed in an observation window.
FIG. 4(b) is a plan view of the simple plunger to be placed in the observation window.
FIG. 4(c) is an exploded perspective view of the simple plunger shown in FIG. 4(b)
FIG. 4(d) is a fragmentary cross-sectional view of the simple plunger placed in the observation window.
Figure 4:
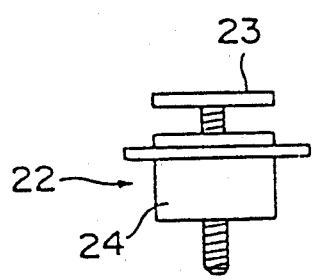
Figure 4:
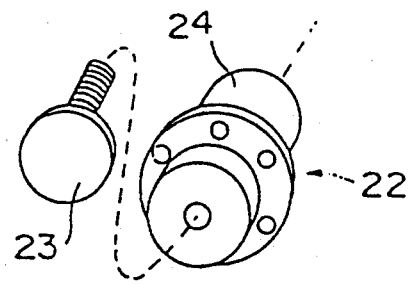
Figure 4:
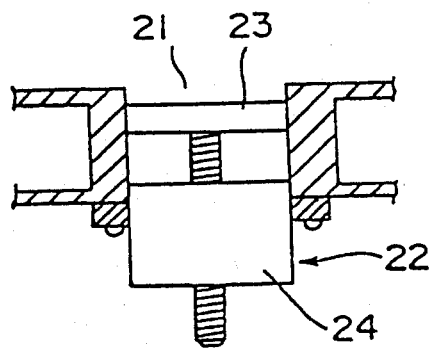

The second plunger may be provided in the observation window 20. More specifically, a simple plunger 22 shown in FIGS. 4(b) and 4(c) is disposed in an observation hole 21 of the observation window 20 shown in FIG. 4(a) in covering relationship to the observation hole 21 as shown in FIG. 4(d). Therefore, the observation window 20 and the plunger 22 are combined with each other in a simple arrangement. The plunger 22 comprises a plate 23 and a support 24, both made of aluminum.

Operation of the microwave plasma CVD apparatus and a method of synthesizing diamond with the microwave plasma CVD apparatus will now be described below.

First, the reaction tube 6 is evacuated by the evacuating pump 16, and then a material gas (including a plasma gas) is supplied into the reaction tube 6 through the material gas supply pipe 15. The material gas for use in synthesizing diamond comprises a mixture of a carbon source gas and an oxygen gas.

The carbon source gas may be a paraffin hydrocarbon such as methane, ethane, propane, butane, or the like, an olefin hydrocarbon such as ethylene, propylene, butylene, or the like, an acetylene hydrocarbon, a diolefin hydrocarbon, an alicyclic hydrocarbon such as cyclopropane, cyclobuthane, or the like, an aromatic hydrocarbon such as benzene, toluene, or the like, a ketone such as acetone, diethyl ketone, or the like, an alcohol such as methanol, ethanol, or the like, an amine such as trimethylamine, triethylamine, or the like, a carbon gas, or carbon monoxide, or a mixture thereof.

Then, a microwave is generated by the microwave oscillator 1, and introduced through the microwave waveguide 2a into the reaction region 7 in the reaction tube 6. The material gas is excited by the microwave and decomposed to generate a plasma around the substrate 14. Now, a diamond film is uniformly deposited by way of vapor growth on the substrate 14 because of the plasma.

During the above reaction, the reaction region 7 may be kept under a pressure ranging from $10^{-3}$ to $10^3$ Torr, preferably from 1 to 800 Torr. The temperature of the surface of the substrate 14 may be in the range of from 300 to 1000° C., preferably from 450 to 950° C. The reaction may continue for such a period of time that the deposited diamond film has a thickness of 1 $\mu$m or more, preferably in the range of from 2 to 10 $\mu$m.

The operator observes the positional relationship between the substrate 14 and the plasma through the observation window on the upper portion of the reaction tube 6. If there is any positional deviation between the substrate 14 and the plasma, then the operator moves the first plunger 5 and/or the second plunger 9 to adjust the position of the plasma. The position of the plasma in the direction of travel of the plasma can be adjusted with the first plunger 5, and the position of the plasma in the direction perpendicular to the direction of travel of the plasma can be adjusted with the second plunger 9.

Figure 5:
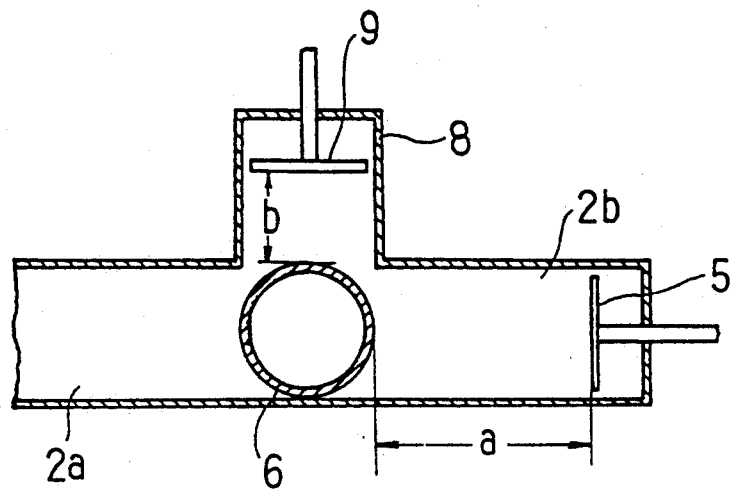
FIG. 5 is a fragmentary cross-sectional view showing the positional relationship between first and second plungers in a microwave plasma CVD apparatus.
Figure 6:
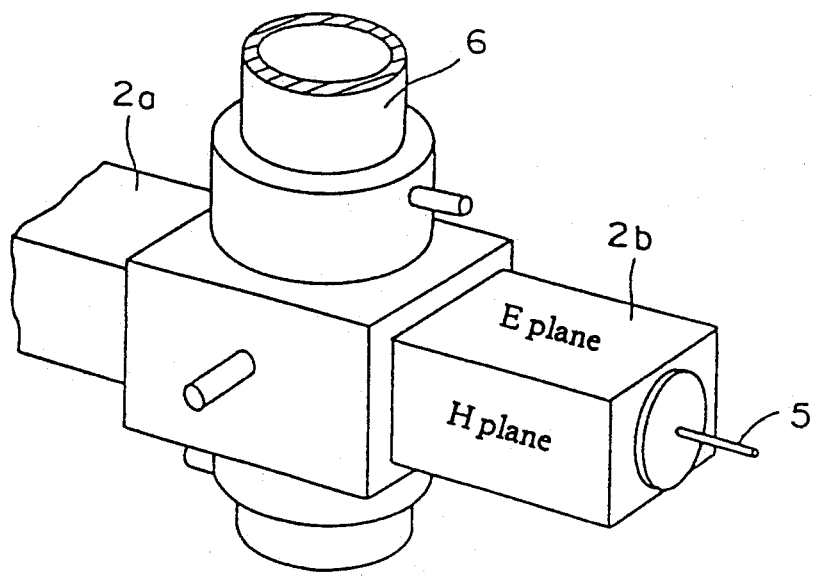
FIG. 6 is a fragmentary perspective view of a conventional microwave plasma CVD apparatus.

The positional movement of the plasma is basically related to the movement of the first and second plungers 5, 9. For example, when the first plunger 5 is moved to the left or right in FIG. 5, the microwave reflected thereby is brought out of phase, causing the plasma to move to the left or right. Upon movement of the second plunger 9 in a forward (downward) direction or a rearward (upward) direction in FIG. 5, the amplitude of the microwave varies out of its center, and the plasma moves forwardly or rearwardly.

The dimension a of a space defined between the first plunger 5 and the reaction tube 6 is such that the reflecting surface of the first plunger 5 is spaced from the center of the reaction tube 6 by a distance which is an integral multiple of half of the wavelength of the microwave, preferably 1 to 4 times half of the wavelength of the microwave. The dimension a should preferably be adjustable in a range of ±1 cm. The dimension b of a space defined between the second plunger 9 and the reaction tube 6 is such that the reflecting surface of the second plunger 9 is aligned with an inner wall surface of the reaction tube 6. The dimension b should preferably be adjustable in a range of ±1 cm.

INVENTIVE EXAMPLE

Using the microwave plasma CVD apparatus shown in FIGS. 1 and 2, a mixed gas of 15 vol. % of Co and 85 vol. % of $H_2$ was supplied at a rate of 100 SCCM into the reaction tube 6, and a plasma was generated around the substrate 14 under a pressure of 40 Torr while the substrate 14 was being maintained at a temperature of 900° C. and the microwave was being generated at a frequency of 2.45 GHz. The substrate 14 was made of silicon (Si) and had a size of 15×15 mm. A thin film of diamond was deposited by way of vapor growth on the substrate 14 for 10 hours.

Initially, the dimension a was 7.5 cm, and the dimension b was 0 cm. Then, the first and second plungers 5, 9 were actuated while the position of the plasma was being observed through the observation window on the upper portion of the reaction tube 6. It was confirmed that the plasma was moved in the respective directions of the plungers for positional adjustment thereof.

As a result of the reaction, a diamond film having a uniform quality and a uniform thickness of 24 $\mu$m was formed on the silicon substrate 14.

COMPARATIVE EXAMPLE

The microwave plasma CVD apparatus shown in FIGS. 1 and 2 was also used to deposit a diamond film on the substrate 14 under the same conditions as those described above in Inventive Example except that the second plunger 9 was not actuated. As a consequence, the plasma of a material gas was localized on the substrate 14. A diamond film formed on the substrate 14 had a thickness of 21 $\mu$m at the center of the substrate 14 and a thickness of 28 $\mu$m at the corners of the substrate 14 though the desired thickness was 24 $\mu$m. Thus, a diamond-coated product with a uniform diamond film thickness was not obtained.

INDUSTRIAL APPLICABILITY

The microwave plasma CVD apparatus according to the present invention and the method of synthesizing diamond with the microwave plasma CVD apparatus can widely be used in the manufacture of cutting tools, wear-resistant lubricating films, speaker materials, optical components, electronic parts materials, or the like.

We claim:

1. A microwave plasma chemical vapor deposition apparatus comprising a microwave oscillator, a microwave waveguide, a first plunger mounted in an end of the microwave waveguide, and a reaction tube extending through the microwave waveguide perpendicularly to an E plane thereof adjacent to the end of the microwave waveguide, said microwave waveguide and said reaction tube jointly defining a reaction region at an intersection thereof, wherein the improvement comprises a second plunger disposed on an H plane of said microwave waveguide adjacent to the end thereof, said second plunger extending perpendicularly to said microwave waveguide and said reaction tube and facing said reaction region.

2. A microwave plasma chemical vapor deposition apparatus according to claim 1, wherein said second plunger is of the type which can fully reflect a microwave propagated through said microwave waveguide.

3. A microwave plasma chemical vapor deposition apparatus according to claim 1, wherein said microwave waveguide has an opening leading to said second plunger, said opening having a length equal to half of the wavelength of a microwave propagated through said microwave waveguide.

* * * * *